US012688344B2

(12) United States Patent
Mistry et al.

(10) Patent No.: US 12,688,344 B2
(45) Date of Patent: Jul. 21, 2026

(54) DYNAMIC MEMORY ALLOCATION IN PROBING SIGNAL STATES

(71) Applicant: Xilinx, Inc., San Jose, CA (US)

(72) Inventors: Alok Mistry, Hyderabad (IN); Niloy Roy, Hyderabad (IN); Shanish Chandra Mishra, Hyderabad (IN); Anil Kumar A V, Hyderabad (IN)

(73) Assignee: XILINX, INC., San Jose, CA (US)

( * ) Notice: Subject to any disclaimer, the term of this patent is extended or adjusted under 35 U.S.C. 154(b) by 639 days.

(21) Appl. No.: 18/137,207

(22) Filed: Apr. 20, 2023

(65) Prior Publication Data

US 2024/0354478 A1     Oct. 24, 2024

(51) Int. Cl.
| | |
|---|---|
| *G06F 30/33* | (2020.01) |
| *G06F 30/327* | (2020.01) |
| *G06F 30/331* | (2020.01) |
| *G06F 30/333* | (2020.01) |
| *G06F 30/34* | (2020.01) |
| *G06F 30/367* | (2020.01) |

(Continued)

(52) U.S. Cl.
CPC ............ *G06F 30/33* (2020.01); *G06F 30/327* (2020.01); *G06F 11/008* (2013.01); *G06F 11/0766* (2013.01); *G06F 11/261* (2013.01); *G06F 30/331* (2020.01); *G06F 30/333* (2020.01); *G06F 30/34* (2020.01); *G06F 30/367* (2020.01); *G06F 30/398* (2020.01); *H03K 19/02* (2013.01)

(58) Field of Classification Search
CPC ...... G06F 30/33; G06F 30/327; G06F 30/331; G06F 30/333; G06F 30/34; G06F 30/367; G06F 30/398; G06F 11/008; G06F 11/0766; G06F 11/261; G06F 11/267; G06F 11/27; H03K 19/7581; H03K 19/18585; H03K 19/02
USPC .... 716/106, 104, 111, 116, 136; 703/16, 17, 703/20; 714/732, 733, 734; 326/16, 41, 326/47, 101
See application file for complete search history.

(56) References Cited

U.S. PATENT DOCUMENTS 10,241,959 B1 * 3/2019 Tianxiang ............ G11C 7/1069
10,896,119 B1    1/2021 Ansari et al.
(Continued)

OTHER PUBLICATIONS

Gao et al., Chinese Patent Document No. CN-108874296-A, published Nov. 23, 2018, 4 pages including abstract and claims. (Year: 2018).*

(Continued)

*Primary Examiner* — Phallaka Kik
(74) *Attorney, Agent, or Firm* — Patterson + Sheridan, LLP

(57) ABSTRACT

Disclosed methods and systems include debug circuitry registering candidate sample values in a plurality of sample periods while application circuitry is active. The candidate sample values indicate states of a plurality of candidate signals of the application circuitry. Sample values of first probed signals from each sample period are written to a sample memory using a mapping based on bit-widths of the first probed signals. The sample values of the first probed signals are selected from the candidate sample values. The mapping is updated based on bit-widths of second probed signals, and sample values of the second probed signals from each sample period are written to the sample memory using the mapping. The sample values of the second probed signals are selected from the candidate sample values.

20 Claims, 8 Drawing Sheets

(51) Int. Cl.
| | |
|---|---|
| *G06F 30/398* | (2020.01) |
| *H03K 19/02* | (2006.01) |
| *G06F 11/00* | (2006.01) |
| *G06F 11/07* | (2006.01) |
| *G06F 11/26* | (2006.01) |

(56) References Cited

U.S. PATENT DOCUMENTS

| | | | |
|---|---|---|---|
| 10,949,586 B1 | 3/2021 | Nareddy et al. | |
| 11,204,821 B1 | 12/2021 | Gopalakrishnan et al. | |
| 11,280,829 B1 | 3/2022 | Poolla et al. | |
| 12,271,593 B1* | 4/2025 | Shende | G06F 3/0644 |
| 2022/0206710 A1* | 6/2022 | Alrod | G06F 11/108 |
| 2023/0145303 A1* | 5/2023 | Tseng | G11C 11/4093 |
| | | | 365/189.05 |
| 2023/0343401 A1* | 10/2023 | Huang | G11C 16/102 |
| 2023/0367480 A1* | 11/2023 | Yoon | G11C 16/3459 |

OTHER PUBLICATIONS

Huang et al., Chinese Patent Document No. CN-114927152-A, published Aug. 19, 2022, 3 pages including abstract and claims. (Year: 2022).*

He et al., Chinese Patent Document No. CN-115604816-A, published Jan. 13, 2023, 3 pages including abstract and claim. (Year: 2023).*

U.S. Appl. No. 17/746,512, filed May 17, 2022, and entitled: Circuit Simulation Based on an RTL Component in Combination With Behavioral Components. The Examiner is referred to the copending patent prosecution of the common Applicant (no attachment).

Vivado Design Suite, "UltraScale Devices Gen3 Integrated Block for PCI Express v4.2", PG156, Dec. 19, 2016, available: www. xilinx.com.

Xilinx, Vivado Design Suite User Guide: Programming and Debugging, www.xilinx.com, UG908 (v2018.2), Jun. 6, 2018.

Xilinx, Vivado Design Suite User Guide: Release Notes, Installation, and Licensing, www.xilinx.com, UG973 (v2019.2), Dec. 17, 2019.

Gupta et al., "Shadow Simulation: A new verification methodology for Configurable Logic", XLNX All Programable, 2016 DVCON Design and Verification Conference and Exhibition, Europe, copyright Accellera Systems Initiative.

* cited by examiner

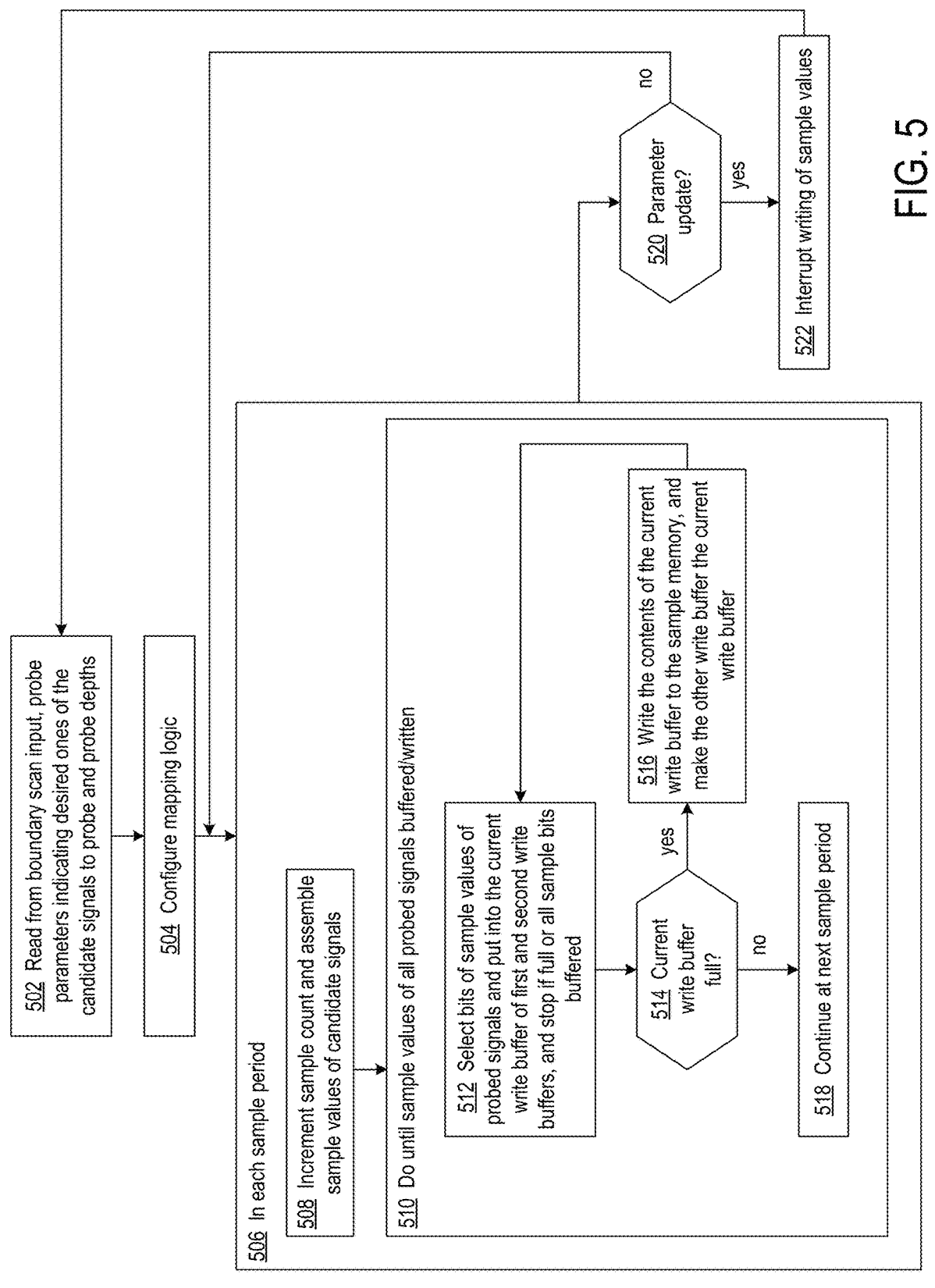

502 Read from boundary scan input, probe parameters indicating desired ones of the candidate signals to probe and probe depths 504 Configure mapping logic 506 In each sample period 508 Increment sample count and assemble sample values of candidate signals 510 Do until sample values of all probed signals buffered/written 512 Select bits of sample values of probed signals and put into the current write buffer of first and second write buffers, and stop if full or all sample bits buffered 514 Current write buffer full?

516 Write the contents of the current write buffer to the sample memory, and make the other write buffer the current write buffer yes no 518 Continue at next sample period 520 Parameter update?

no yes

522 Interrupt writing of sample values

FIG. 5

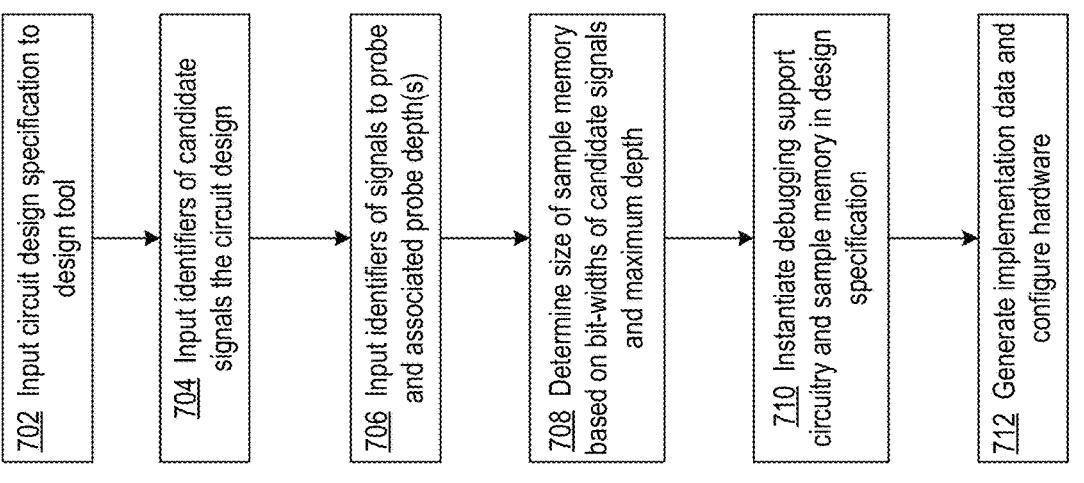

702 Input circuit design specification to design tool

704 Input identifiers of candidate signals the circuit design

706 Input identifiers of signals to probe and associated probe depth(s)

708 Determine size of sample memory based on bit-widths of candidate signals and maximum depth 710 Instantiate debugging support circuitry and sample memory in design specification 712 Generate implementation data and configure hardware

602 Get next sample bit

604 Bit of probed signal AND sample count < probe depth?

606 Put bit in write buffer

608 End of sample OR write buffer full?

no yes no yes

FIG. 6

DYNAMIC MEMORY ALLOCATION IN PROBING SIGNAL STATES

TECHNICAL FIELD

The disclosure generally relates to probing signal states.

BACKGROUND

Debugging a circuit design can generally involve specifying the signals of interest, building a circuit, such as an implementation on an FPGA, running the circuit for some number of clock cycles, and analyzing the captured states of the signals of interest relative to the logic of the design. Debugging support logic is combined with the design logic to capture states of the signals in building the circuit, and during the debug run, the debugging support logic captures states of the signals of interest and stores data indicating the states for subsequent analysis.

In building the circuit, a design tool allocates memory sufficient to store the state data for some number of samples for each of the signals of interest based on designer input. During the course of debugging, the designer may determine that a greater number of samples for some signals would be helpful and that probing other signals is no longer necessary. However, making the desired changes in the debugging logic may require rebuilding the circuit design, which can be very time-consuming. Rebuilding the circuit design includes incremental or full synthesis, place-and-route, generation of implementation data, and configuration of a programmable integrated circuit or building of an application specific integrated circuit (ASIC).

Efforts to avoid the lengthy rebuilding process have often resulted in inefficient use of device resources. According to one approach, the designer might avoid rebuilding the circuit design by initially specifying a large number of samples for the signals of interest. However, this approach creates an excess demand for memory resources, which could negatively impact the application logic of the circuit design. According to another approach, multiplexer circuitry can be implemented in the debugging support logic, allowing the designer to select which signals to probe during a debugging run. However, a very large multiplexer structure would be required to allow the designer to select from all possible combinations. Alternatively, a smaller multiplexer structure would limit the number of combinations available for selection.

SUMMARY

A disclosed method includes registering by debug circuitry, candidate sample values in a plurality of sample periods while application circuitry is active. The candidate sample values indicate states of a plurality of candidate signals of the application circuitry. The method includes writing sample values of first probed signals from each sample period to a sample memory using a mapping based on bit-widths of the first probed signals. The sample values of the first probed signals are selected from the candidate sample values. The method includes updating the mapping based on bit-widths of second probed signals, and writing sample values of the second probed signals from each sample period to the sample memory using the mapping. The sample values of the second probed signals are selected from the candidate sample values.

A disclosed system includes a sample memory, a capture circuit, and a memory manager. The capture circuit is configured to register candidate sample values in each sample period of a plurality of sample periods while application circuitry is active. The candidate sample values indicate states of a plurality of candidate signals of the application circuitry. The memory manager circuit is coupled between the sample memory and the capture circuit and is configured to write sample values of first probed signals from each sample period to the sample memory using a mapping based on bit-widths of the first probed signals. The sample values of the first probed signals are selected from the candidate sample values. The memory manager is configured to update the mapping based on bit-widths of second probed signals, and to write sample values of the second probed signals from each sample period to the sample memory using the mapping. The sample values of the second probed signals are selected from the candidate sample values.

Other features will be recognized from consideration of the Detailed Description and Claims, which follow.

BRIEF DESCRIPTION OF THE DRAWINGS

Various aspects and features of the methods and systems will become apparent upon review of the following detailed description and upon reference to the drawings in which:

FIG. 5 shows a flowchart of a process in which debugging support circuitry is responsive to adjustment of probe parameters at debug runtime;

FIG. 6 shows a flowchart of a process by which the debug memory manager selects bits of the candidate sample values and buffers the selected bits;

FIG. 7 shows a flowchart of a process for building an implementation of application circuitry and debugging support circuitry according to an example;

DETAILED DESCRIPTION

Figure 1:
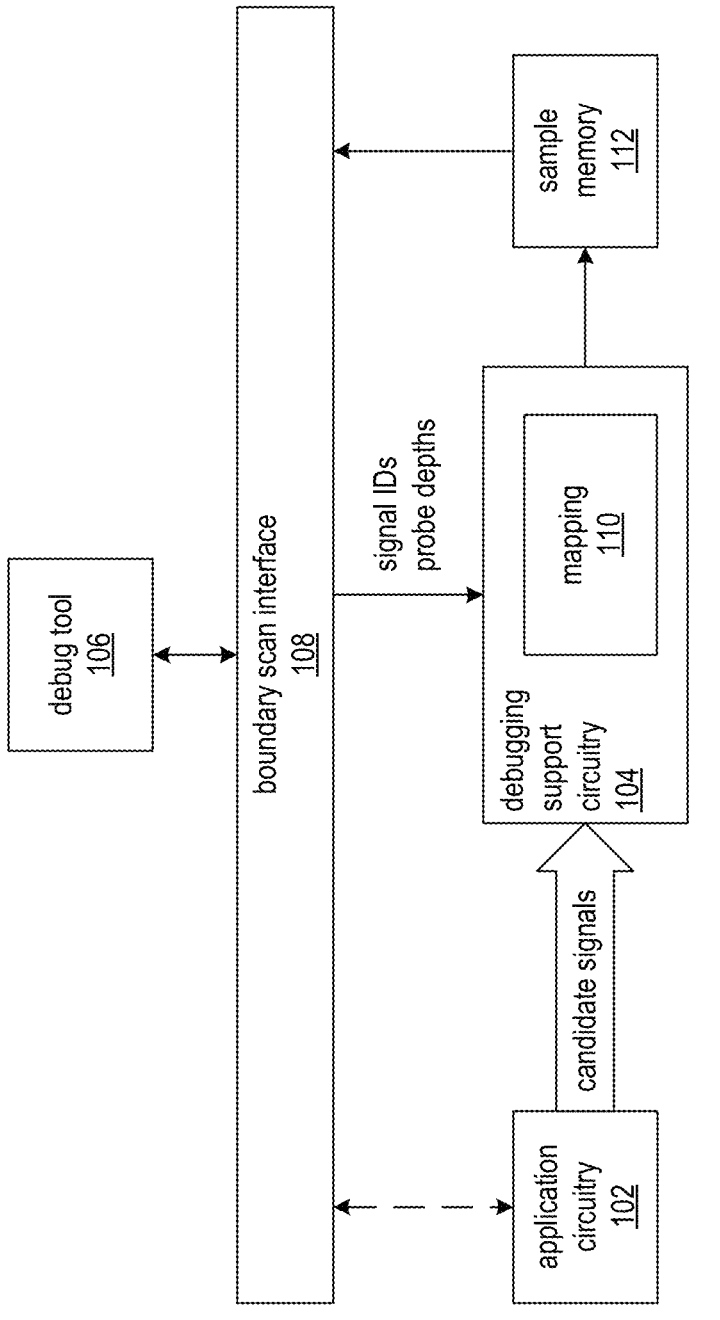
FIG. 1 shows a system for debugging application circuitry 102 using debugging support circuitry and a debug tool.

In the following description, numerous specific details are set forth to describe specific examples presented herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element.

This disclosed circuitry and methods efficiently utilize memory while supporting at debug runtime the selection of signals to probe along with probe depths of those signals. A designer can select any combination of candidate signals for probing at debug runtime without having to rebuild the design and debug circuitry. The debug circuity employs mapping logic that selects sample values of the designated probed signals and writes the sample values to the sample memory based on the bit-widths and probe depths of the probed signals. The debug circuitry allows a designer to change the focus from one subset of the candidate signals to a different subset and also to adjust the probe depths at debug runtime. For example, the designer can select fewer signals and increase the probe depths, select more signals and decrease the probe depths, or select different probe depths for the signals.

FIG. 1 shows a system for debugging application circuitry 102 using debugging support circuitry 104 and a debug tool 106. The application circuitry 102 is the circuit undergoing debugging and can have millions of signals. For debugging purposes, when the combination of application circuitry and debugging support circuitry is built, the designer designates a subset of all the signals in the design as being eligible to be probed. The signals specified prior to building the combined application and debug circuitry as being eligible to be probed are referred to herein as the "candidate signals." A "probed signal" is one of the candidate signals whose value is stored in a sample memory 112 for subsequent analysis. For ease of exposition, the singular "signal" is used to refer to signals carrying both single-bit and multi-bit values.

The debug tool 106 can be a component of an Electronic Design Automation (EDA) system, which provides logic synthesis, place-and-route, optimization and associated processes for generating configuration data to implement and interact with an application circuit. Together, these processes can be referred to as an "implementation flow." The EDA system performs the implementation flow at "build time" to generate configuration data for implementing the application circuitry 102 in combination with the debugging support circuitry 104.

The debugging support circuitry 104 is generated by the EDA system and is configured to register the states of the candidate signals from the application circuitry in each sample period. A sample period can be one period of a clock signal provided to the application circuitry and debugging support circuitry, for example.

Figure 2:
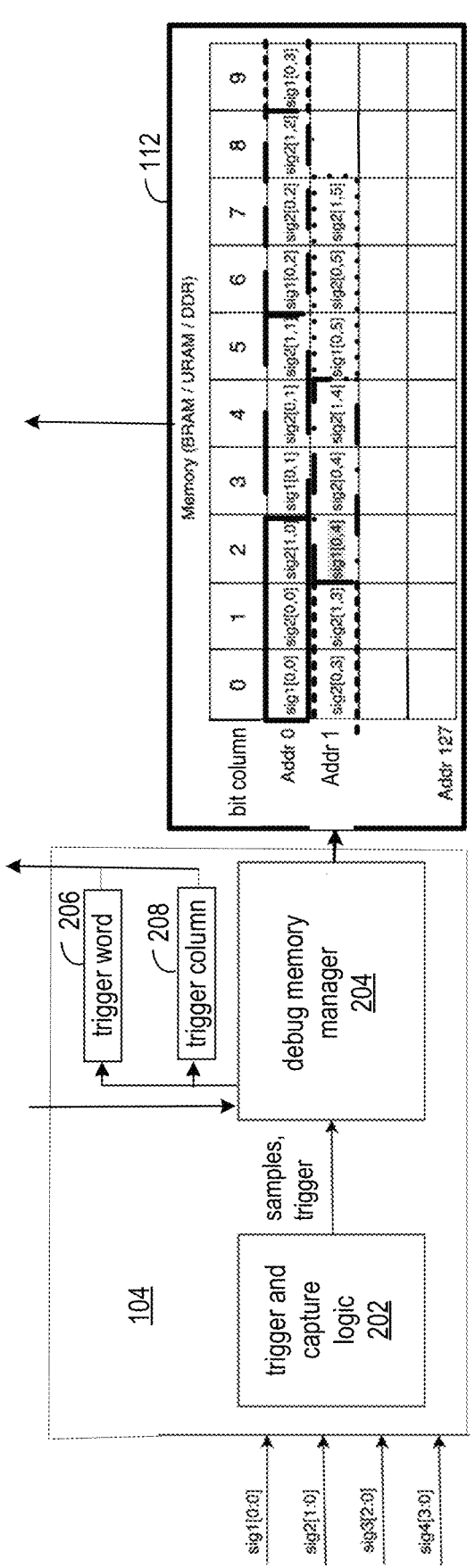
FIG. 2 illustrates debug support circuitry and mapping of sample values in a sample memory according to an example of four candidate signals.

The debugging support circuitry includes capture and trigger circuitry (FIG. 2). While the application circuitry is active (being clocked by the clock signal), the capture circuitry registers states of the candidate signals as sample values in each sample period. The state of a candidate signal is referred to as a "candidate sample value." The triggering logic detects and signals when a logic condition is satisfied by the states of one or more of the candidate signals in a sample period.

The mapping circuitry 110 (or "mapping logic") selects a subset of the candidate sample values for writing to the sample memory. The subset can be all of the candidate sample values or a proper subset thereof. According to the disclosed methods and systems, the probed signals can be designated at debug time without requiring rebuilding of the application circuitry and debugging support circuitry. "Debug time" refers to the time after the application circuitry and debugging support circuitry have been made operational (e.g., configuring a programmable integrated circuit). The selection of probed signals by the debugging support circuitry can be in response to signal identifiers of the probed signals as communicated from the debug tool via the boundary scan interface.

The selection and writing to the sample memory can be based on bit-widths and probe depths of the probed signals.

The "probe depth" is the number of sample periods in which the sample value of a probed signal is selected and written to the sample memory. The debugging support circuitry makes efficient use of the sample memory by allowing different probe depths for different ones of the probed signals. For example, one probed signal can have a probe depth of 256 sample periods, and another probed signal can have a probe depth of 1024 sample periods. The mapping by which the debugging support circuitry selects and writes sample values can be updated at debug runtime through the boundary scan interface 108.

The debugging support circuitry receives instructions from the debug tool via boundary scan interface 108, as specified by the standard, IEEE 1149, for example. In response to new parameters provided via the boundary scan interface while the application circuitry and debugging support circuitry are active, the debugging support circuitry temporarily interrupts the selection and writing of sample values. The new parameters can specify different signals to probe and/or change the probe depths of one or more of the probed signals. The changed parameters cause the mapping logic 110 to update the mapping based on the bit-widths of the probed signals. Once the mapping has been updated, the mapping logic can begin selecting the sample values of the newly designated probed signals and writing the selected sample values to the sample memory using the updated mapping. Depending on application requirements, the application circuitry 102 may or may not be connected to the boundary scan interface as shown by the dashed line.

The sample memory 112 used for logging sample values can be memory disposed on the same semi-conductor die as the application circuitry or on another semi-conductor die. For example, in AMD programmable ICs, the sample memory can be implemented as on-chip Block RAM ("BRAM") Ultra-RAM ("URAM"), or off-chip double data rate ("DDR") RAM. The sample values in the sample memory can be read by the debug tool and rendered as waveforms on a display device.

FIG. 2 illustrates debug support circuitry and mapping of sample values in a sample memory according to an example of four candidate signals, two of which are probed. The debugging support circuitry 104 includes trigger and capture logic 202 and a debug memory manager 204. The debug memory manager writes to the trigger word register 206 and the trigger column register 208 in response to a trigger signal from the trigger and capture logic, as explained in more detail below.

The trigger and capture logic 202 registers sample values of all the candidate signals in each sample period. The set of all sample values of the candidate signals captured in one sample period can be referred to as a "sample." In registering the sample values, the trigger and capture logic stores the sample values of the candidate signals in registers (not shown) that are associated with the candidate signals and readable by the debug memory manager. The example of FIG. 2 has candidate signals "sig1," "sig2," "sig3," and "sig4" connected to the debugging support circuitry, and specifically to the trigger and capture logic 202. The bit-width of "sig1" is 1 bit, which is denoted as sig1 [0:0], the bit-width of sig2 is two bits (sig2 [1:0]), the bit-width of sig3 is 3 bits (sig3 [2:0]), and the bit-width of sig4 is four bits (sig4 [3:0]).

The debug memory manager inputs identifiers of signals to probe and associated probe depths via the boundary scan interface. In the example, of the four candidate signals, sig1 and sig2 are selected for probing. Based on the bit-widths of the probed signals and the probe depths, mapping logic of the debug memory manager selects sample values of the probed signals and stores bit of the sample values at locations in the sample memory based on the bit-widths and probe depths. The locations are based on the probe depths in that once the sample count of a probed signal is reached, the debug memory manager stops writing sample values of that probed signal to the sample memory, but continues writing sample values of other probed signals whose probe depths have not been reached.

The exemplary sample memory is 128, 10-bit words, and the example of FIG. 2 shows the bit layout in the sample memory of sample values of sig1 and sig2 from six sample periods. According to an exemplary approach, the bit-width of the sample memory is equal to the total bit-width of the all the candidate signals, which allows storing of all the bits in the memory in a single clock cycle for scenarios in which all the candidate signals are selected for probing. The bits of each sample value are denoted in the sample memory by the name of the probed signal, the bit position within the sample value, and the number of the sample period. For example, "sig2 [0,1]" denotes sig1, bit 0, sample period 1, and "sig2 [1,1]" denotes sig1, bit 1, sample period 1. The delineation between sample values of the six sample periods is shown by boxes having different types of lines.

The debug memory manager buffers bits of sample values until there is a sufficient number of bits to write a full word to the sample memory. The bits of multiple sample values (and also of multiple sample periods) are written to contiguous bit addresses in the sample memory. In the example, the debug memory manager buffers bits of sample values of sig1 and sig2 selected in sample periods 0, 1, 2, because the sample memory is 10 bits wide and a full word is not yet complete. Only 9 sample value bits are buffered. In sample period 3, the debug memory manager selects bit 0 of probed sig1 to complete a 10-bit word, and the word is written to address 0 of the sample memory. In word 0 of the sample memory, bit columns 0, 1 and 2 have the one bit of sig1 and bits 0 and 1 of sig 2 from sample period 0, respectively; bit columns 3, 4, and 5 have the one bit of sig1 bits 0 and 1 of sig 2 from sample period 1, respectively; bit columns 6, 7, and 8 have the one bit of sig1 and bits 0 and 1 of sig 2 from sample period 2, respectively; and bit column 9 has the one bit of sig1 from sample period 3.

The debug memory manager buffers the two bits of sig2 from sample period 3, and those bits are not written to the sample memory until another full word can be written, which in the example would not occur until sample period 6 (not shown). Thus, if the bit-widths of the sample values do not align with word boundaries of the sample memory, the debug memory manager will write sample values across word address boundaries. That is, depending on the bit-widths of the sample values, part of a sample value may be stored in address n, and another part stored in address n+1. Also depending on the bit-widths, one sample value of sample period m may be stored in address n, and another sample value from sample period m stored in address n+1. The width of the sample memory can be adjusted to satisfy debugging requirements.

Along with capturing the sample values of the candidate signals, the trigger and capture logic asserts a trigger signal in response to detecting a trigger condition based on the states of one or more of the candidate signals. The trigger condition to be changed at runtime by way of the debug memory manager inputting data that define a trigger condition via the boundary scan interface. In response to assertion of the trigger signal, the debug memory manager stores values in the trigger word register 206 and the trigger column register 208. The value in the trigger word register indicates the next word address in the sample memory to which the debug memory manager will write. The value in the trigger column register indicates the bit column at the first bit of the first sample value in the current sample period will be written. For example, in response to assertion of the trigger signal at sample period 4, the debug memory manager stores 1 (address 1 of the sample memory) in the trigger word register and 2 (bit column 2) in the trigger column register. If multiple trigger conditions are defined to be detected by the trigger and capture logic, and the trigger conditions are detected at different sample periods, the debug memory manager stores the sample memory location in the trigger word register and trigger column register in response to the first-detected condition and ignores the second-detected trigger condition.

The debug tool can use the values in the trigger word register and the trigger column register to indicate in a waveform rendering of the probed signals, the sample period at which the trigger condition occurred.

Figure 3:
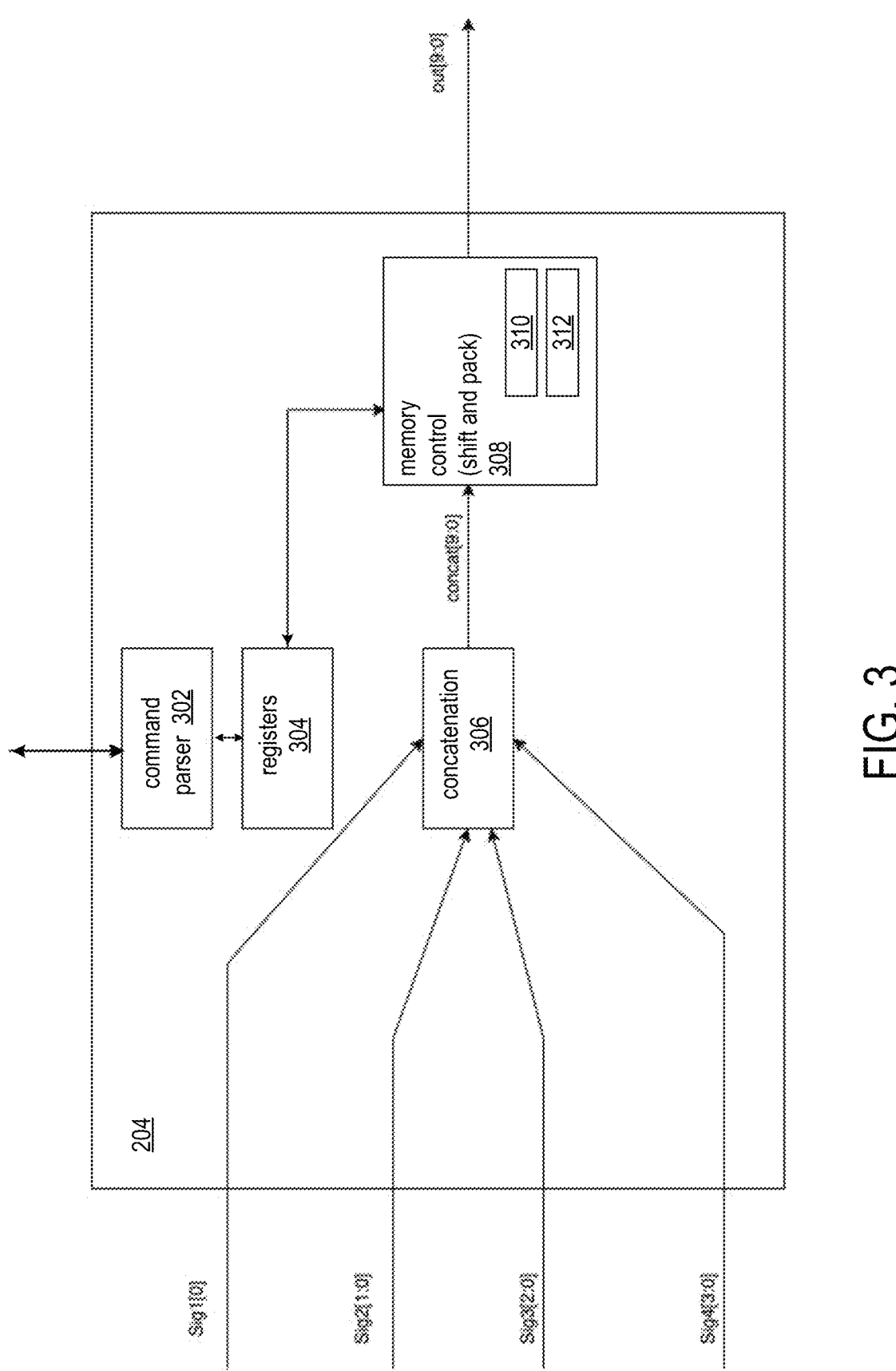
FIG. 3 shows the circuitry of the debug memory manager as configured to accommodate the example of FIG. 2.

FIG. 3 shows the circuitry of the debug memory manager 204 as configured to accommodate the example of FIG. 2. The debug memory manager has a command parser 302, which is compatible with the boundary scan interface, for receiving commands that identify one or more of the candidate signals to probe and the respective probe depth(s). The command parser stores identifiers of the signals to probe and the associated probe depths in registers 304. The registers 304 stores one bit per candidate signal, and the bit value indicates whether or not the signal is to be probed. In the example involving four candidate signals, four bits are configured to indicate which signals to probe.

The concatenation logic 306 receives the sample values of all candidate signals, which in the example are sig1, sig2, sig3, and sig4, from the trigger and capture logic (FIG. 2, 202). In building the debugging support circuitry (FIG. 1, 104), the design tool configures the trigger and capture logic to register sample values in registers associated with the candidate signals. The design tool also configures the concatenation logic to concatenate the candidate sample values in a particular order. During implementation, the bit-widths of the candidate signals are propagated as parameters to the debug memory manager, which enables selection of bits of the probed signals as indicated by the states of the registers 304. The memory control logic 308 is configured to select the sample values of the probed signals from the concatenation based on that order. In the example, the total number of bits in the sample values of sig1, sig2, sig3, and sig4 is 10 bits, and the output from the concatenation logic is a 10-bit sequence of the bits of the sample values, shown as "concat [9:0]."

The memory control logic 308 is configured to select sample values of probed signals, buffer the sample values, and write the buffered sample values to the sample memory 112. The registers 304 and memory control logic are an exemplary implementation of the mapping logic (FIG. 1, 110). The registers indicate the sample values and bits to select, selection logic of the memory control 308 selects bits of sample values of the probed signals, and write control logic of the memory control buffers bits of the sample values in order to write full words to the sample memory. In response to input to the command parser indicating different ones of the candidate signals to probe and/or indicating different probe depths, the mapping logic is updated, with the effect being the selection of different sample values and/or writing the selected sample values to different locations in the sample memory based on the bit-widths and probe depths.

The memory control logic selects sample values of the probed signals in response to the contents of the registers 304. The memory control logic also counts samples in order to limit the number of sample values logged to the probe depths associated with the probed signals. The probe depth associated with a probed signal and specified in the registers 304, limits the number of samples in which the sample value of that probed signal is selected and logged to the sample memory. Once the sample count reaches the probe depth associated with a sampled signal, the memory control logic ceases to select sample values of that sampled signal for logging. The sample count is the number of sample periods in which the sample values of a probed signal have been selected and written to the sample memory.

The memory control logic accumulates bits of sample values in a buffer register in order to write a complete word to the sample memory. A complete word is a word that is equal in size to an addressable word of the sample memory and all bits have bit values of one or more sample values.

A ping pong buffer arrangement is employed by the memory control logic to handle buffering of sample values that do not align with word boundaries of the sample memory. In the ping pong buffer arrangement, the memory control logic uses two buffer registers 310 and 312. One of the registers is the current register in which the memory control logic is buffering bits of the selected sample values. Once the current buffer register has a complete word, the memory control logic writes the contents of the current buffer register to the sample memory, and the other buffer register is made the current buffer register in which bits of the sample values are buffered.

The writes by the memory control logic to the sample memory are in sequential address order. According to one mode, once the sample memory is full, the memory control logic stops buffering sample values and writing to the sample memory. According to another mode, the memory control logic writes to the sample memory in the manner of a circular buffer.

Figure 4:
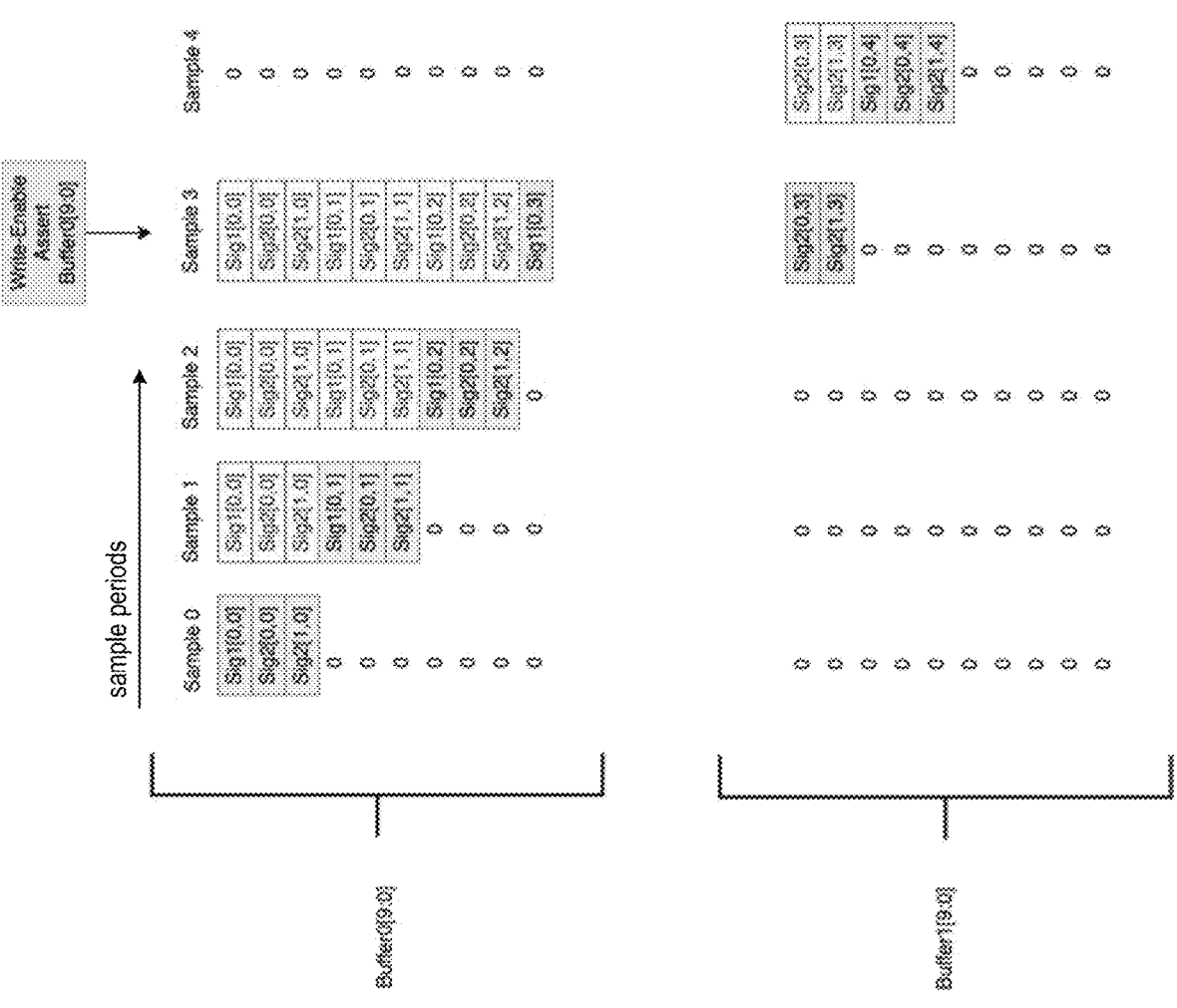
FIG. 4 shows the contents of the ping pong buffer registers over five samples according to the example of FIG. 2.

FIG. 4 shows the contents of the ping pong buffer registers over five samples (Sample 0, . . . , Sample 4) according to the example of FIG. 2. The exemplary buffer registers, Buffer0 and Buffer1, correspond to the ping pong registers 310 and 312 of FIG. 3 and are each 10 bits wide. The probed signals are sig1 and sig2.

Upon receiving sample 0, the memory control logic selects bits of the sample values of sig1 and sig2 from the concatenated sample values and stores the bits in bit positions 0, 1, and 2 of Buffer0. The bits of the sample values of sig3 and sig4 are not selected for buffering by the memory control logic. Upon receiving sample 1, the memory control logic selects bits of the sample values of sig1 and sig2 from the concatenated sample values and stores the bits in bit positions 3, 4, and 5 of Buffer0. Upon receiving sample 2, the memory control logic selects bits of the sample values of sig1 and sig2 from the concatenated sample values and stores the bits in bit positions 6, 7, and 8 of Buffer0.

Upon receiving sample 3, the memory control logic selects bits of the sample values of sig1 and sig2 from the concatenated sample values and stores the one bit of sig1 in bit position 9 of Buffer0. At this time Buffer0 is filled with valid sample data, and the write control logic asserts a write enable signal to the sample memory along with data signals from Buffer0. Buffer1 is made the current buffer and the two bits of sig2 from sample 3 are stored in bit positions 0 and 1 of Buffer1. Upon receiving sample 4, the memory control logic clears the contents from Buffer0, selects bits of the sample values of sig1 and sig2 from the concatenated sample values and stores the bits in bit positions 2, 3, and 4 of Buffer1. Once Buffer1 is filled with valid data, the memory control logic will write the contents to the sample memory and switch to buffering sample bits in Buffer0.

FIG. 5 shows a flowchart of a process in which debugging support circuitry is responsive to adjustment of probe parameters at debug runtime. The probe parameters control which ones of the candidate signals of the application circuitry are selected for probing along with probe depths of the probed signals. Prior to commencing the process of FIG. 5, the debugging tool (FIG. 1, 106) has configured an integrated circuit (IC) device with the application circuitry and debugging support circuitry and then connected to the IC device. Also, a designer has selected one or more of the candidate signals to probe and invoked controls of the debug tool to download probe parameters to the debugging support circuitry.

At block 502, the debugging memory manager (FIG. 2, 204) reads from boundary scan input, probe parameters that indicate which ones of the candidate signals are to be probed. At block 504, the debugging memory manager configures the registers (FIG. 3, 304) of the mapping logic (FIG. 1, 110) with the probe parameters.

The debugging memory manager performs the processing of block 506 in each sample period. At block 508, the debug memory manager increments the sample count, and the concatenation circuitry (FIG. 3, 306) assembles the sample values of all the candidate signals captured by the trigger and capture logic (FIG. 2, 202) into a concatenated string of bits. The debug memory manager performs the processing of block 510 until the sample values of all the probed signals have been processed. At block 512, the debug memory manager selects bits from the concatenated string of bits and stores the bits in the current write buffer (FIG. 3, 310 or 312). Once the current write buffer is full or all bits of the sample values from the sample period have been processed, the debug memory manager stops writing bits to the full write buffer.

At decision block 514, if the debug memory stops storing to the current write buffer because the current write buffer is full, the debug memory manager writes the contents of the current write buffer to the sample memory at block 516 and makes the other write buffer the current write buffer. Returning to block 512, the debug memory manager resumes selecting bits and stores the bits beginning at bit 0 of the current write buffer.

At decision block 518, if the debug memory manager stops storing to the current write buffer because the sampled bits of the current sample period have been processed and the current write buffer is not full, the debug memory manager returns to block 508 to assemble the bits from the next sample period. In processing the sampled bits of the next sample period, the debug memory manager begins storing bits in the current write buffer at the bit position that follows the bit position at which the last bit of the previous sample period was stored.

At debug runtime, the designer can specify new probe parameters to change which candidate signals are probed and/or the probe depths of the probed signals. At decision block 520, the debug memory manager can determine in response to boundary scan input, whether or not the mapping logic should be updated based on new probe parameters. If no updated is needed, the debug memory manager can continue the processing of block 506. Otherwise, at block

522 the debug memory manager interrupts the selecting and writing of sample values to the sample memory and reads the new parameters at block 502. Upon updating the mapping logic with the new probe parameters, the debug memory manager can begin writing to the sample memory in the same address space that was used for the prior set of probe parameters.

FIG. 6 shows a flowchart of a process that implements the operations of FIG. 5, block 512, by which the debug memory manager selects bits of the candidate sample values and buffers the selected bits. At block 602, the debug memory manger gets the next bit from the concatenated bits of the candidate sample values. At decision block 604, the debug memory manager determines whether or not the bit is a bit of a probed signal and the sample count is less than the probe depth associated with the probed signal. In response to both conditions being satisfied, at block 606 the debug memory manager puts the bit in the write buffer at the next bit position. In response to the bit not being a bit of a probed signal or the sample count being equal or greater to the probe depth, the debug memory manager bypasses storing the bit in the write buffer and proceeds to decision block 608. At decision block 608, the debug memory manager determines whether or not all bits of the concatenation of bits of the candidate sample values have been processed or the write buffer is full. If either condition is satisfied, the debug memory manager continues the processing as described by block 514 of FIG. 5. Otherwise, the debug memory manager returns to block 602 to process the next sample bit.

FIG. 7 shows a flowchart of a process for building an implementation of application circuitry and debugging support circuitry according to an example. At block 702, the EDA system inputs a circuit design specification of the application circuitry that is to be debugged. At block 704, the EDA system inputs identifiers of a subset of signals of the circuit design as candidates for probing. At block 706, the EDA system inputs identifiers of one or more of the candidate signals as the signals to be probed. Additionally, the EDA system can input a single probe depth or multiple probe depths that are associated with the probed signals. The EDA system at block 708 determines the size required of the sample memory based on bit-widths of the probed signals and a maximum probe depth. The maximum probe depth can be a value specified by the designer with an upper limit imposed by the EDA system, for example. At block 710, the EDA system instantiates the design of the debugging support circuitry and sample memory specification with the application circuit design. At block 712, the EDA system generates implementation data and configures a target IC device with the implementation data to implement the application circuitry and debugging support circuitry. In generating the implementation data, the EDA system synthesizes, places-and-routes, performs physical optimizations, and produces implementation data suitable for making an operable circuit consistent with the disclosed methods and circuitry.

Figure 8:
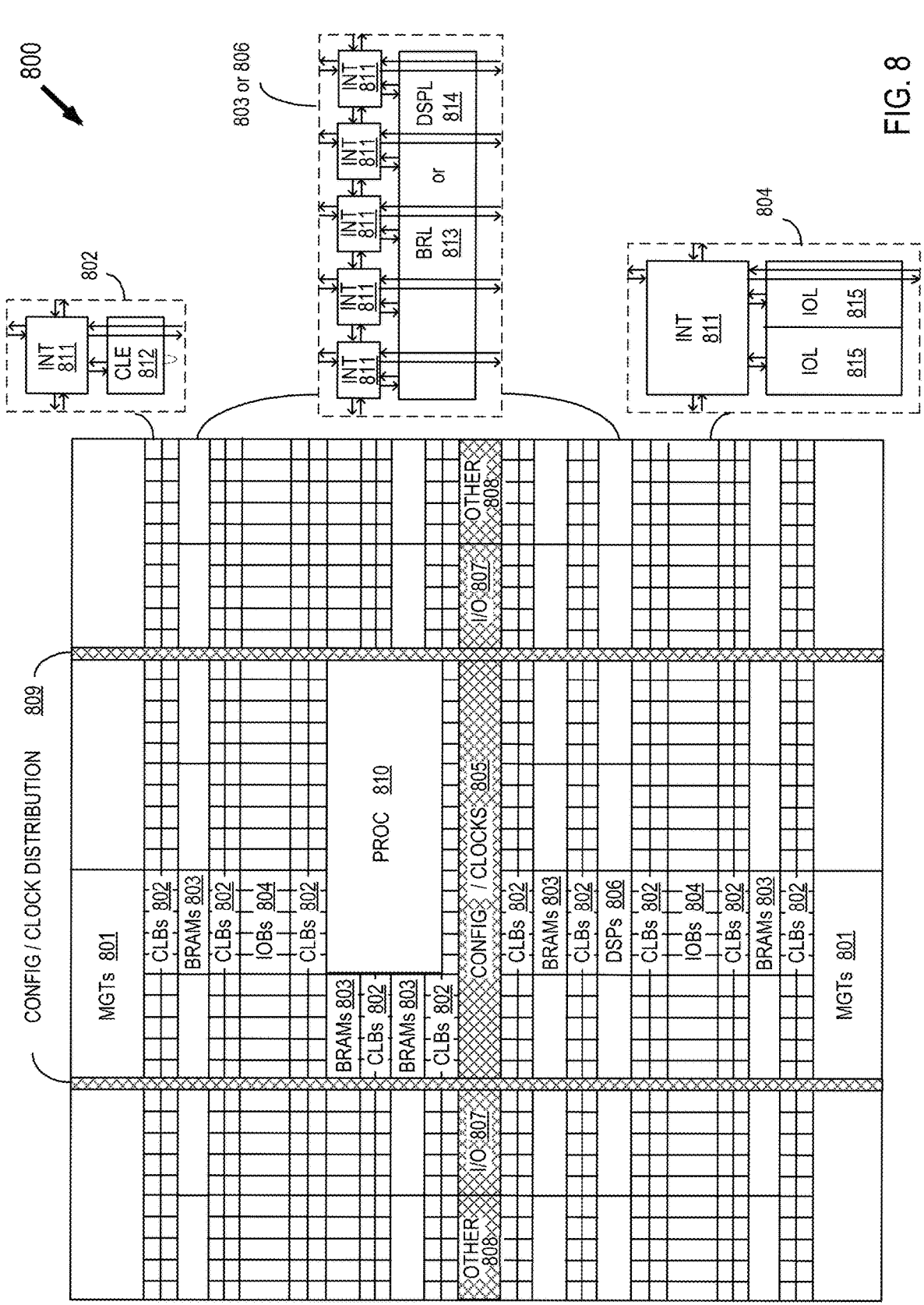
FIG. 8 shows a programmable integrated circuit on which the disclosed application and debugging support circuitry can be implemented.

FIG. 8 shows a programmable integrated circuit (IC) 800 on which the disclosed application and debugging support circuitry can be implemented. The programmable IC may also be referred to as a System On Chip (SOC) that includes field programmable gate array logic (FPGA) along with other programmable resources. FPGA logic may include several different types of programmable logic blocks in the array. For example, FIG. 8 illustrates programmable IC 800 that includes a large number of different programmable tiles including multi-gigabit transceivers (MGTs) 801, configurable logic blocks (CLBs) 802, random access memory blocks (BRAMs) 803, input/output blocks (IOBs) 804, configuration and clocking logic (CONFIG/CLOCKS) 805, digital signal processing blocks (DSPs) 806, specialized input/output blocks (I/O) 807, for example, clock ports, and other programmable logic 808 such as digital clock managers, analog-to-digital converters, system monitoring logic, and so forth. Some programmable IC having FPGA logic also include dedicated processor blocks (PROC) 810 and internal and external reconfiguration ports (not shown). Application circuit designs and designs of debugging support circuitry according to the disclosed approaches can also be implemented as ASICs or on an adaptive compute acceleration platform (ACAP). An ACAP has FPGA fabric with distributed memory and hardware-programmable DSP blocks, a multicore SoC, and one or more software programmable, yet hardware adaptable, compute engines, all connected through a network on chip (NoC).

In some FPGA logic, each programmable tile includes a programmable interconnect element (INT) 811 having standardized connections to and from a corresponding interconnect element in each adjacent tile. Therefore, the programmable interconnect elements taken together implement the programmable interconnect structure for the illustrated FPGA logic. The programmable interconnect element INT 811 also includes the connections to and from the programmable logic element within the same tile, as shown by the examples included at the top of FIG. 8.

For example, a CLB 802 can include a configurable logic element (CLE) 812 that can be programmed to implement user logic, plus a single programmable interconnect element INT 811. A BRAM 803 can include a BRAM logic element (BRL) 813 in addition to one or more programmable interconnect elements. Typically, the number of interconnect elements included in a tile depends on the height of the tile. The illustrated BRAM tile has the same height as five CLBs, but other numbers (e.g., four) can also be used. A DSP tile 806 can include a DSP logic element (DSPL) 814 in addition to an appropriate number of programmable interconnect elements. An IOB 804 can include, for example, two instances of an input/output logic element (IOL) 815 in addition to one instance of the programmable interconnect element INT 811. As will be clear to those of skill in the art, the actual I/O bond pads connected, for example, to the I/O logic element 815, are manufactured using metal layered above the various illustrated logic blocks, and typically are not confined to the area of the input/output logic element 815.

A columnar area near the center of the die (shown shaded in FIG. 8) is used for configuration, clock, and other control logic. Horizontal areas 809 extending from this column are used to distribute the clocks and configuration signals across the breadth of the programmable IC. Note that the references to "columnar" and "horizontal" areas are relative to viewing the drawing in a portrait orientation.

Some programmable ICs utilizing the architecture illustrated in FIG. 8 include additional logic blocks that disrupt the regular columnar structure making up a large part of the programmable IC. The additional logic blocks can be programmable blocks and/or dedicated logic. For example, the processor block PROC 810 shown in FIG. 8 spans several columns of CLBs and BRAMs.

Note that FIG. 8 is intended to illustrate only an exemplary programmable IC architecture. The numbers of logic blocks in a column, the relative widths of the columns, the number and order of columns, the types of logic blocks included in the columns, the relative sizes of the logic blocks, and the interconnect/logic implementations included at the top of FIG. 8 are purely exemplary. For example, in an actual programmable IC, more than one adjacent column of CLBs is typically included wherever the CLBs appear, to facilitate the efficient implementation of user logic.

Figure 9:
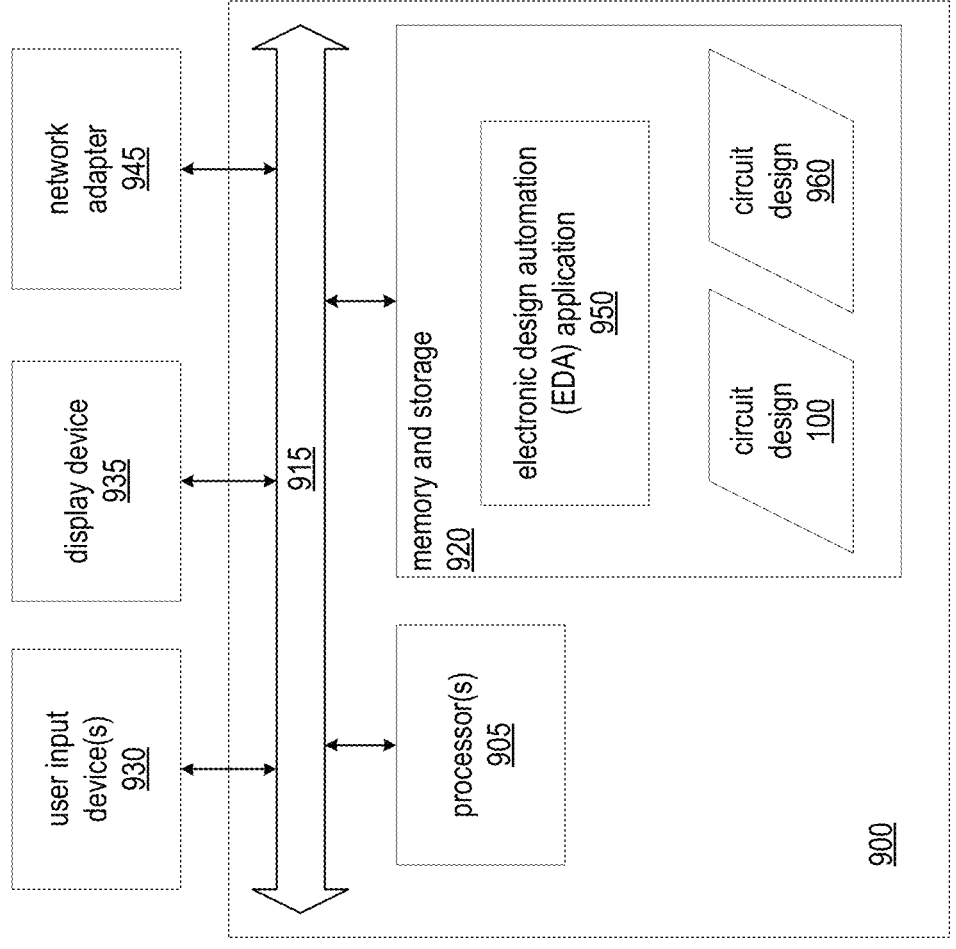
FIG. 9 is a block diagram illustrating an exemplary data processing system.

FIG. 9 is a block diagram illustrating an exemplary data processing system (system) 900. System 900 is an example of an EDA system. As pictured, system 900 includes at least one processor circuit (or "processor"), e.g., a central processing unit (CPU) 905 coupled to memory and storage arrangement 920 through a system bus 915 or other suitable circuitry. System 900 stores program code and circuit design 100 within memory and storage arrangement 920. Processor 905 executes the program code accessed from the memory and storage arrangement 920 via system bus 915. In one aspect, system 900 is implemented as a computer or other data processing system that is suitable for storing and/or executing program code. It should be appreciated, however, that system 900 can be implemented in the form of any system including a processor and memory that is capable of performing the functions described within this disclosure.

Memory and storage arrangement 920 includes one or more physical memory devices such as, for example, a local memory (not shown) and a persistent storage device (not shown). Local memory refers to random access memory or other non-persistent memory device(s) generally used during actual execution of the program code. Persistent storage can be implemented as a hard disk drive (HDD), a solid state drive (SSD), or other persistent data storage device. System 900 may also include one or more cache memories (not shown) that provide temporary storage of at least some program code and data in order to reduce the number of times program code and data must be retrieved from local memory and persistent storage during execution.

Input/output (I/O) devices such as user input device(s) 930 and a display device 935 may be optionally coupled to system 900. The I/O devices may be coupled to system 900 either directly or through intervening I/O controllers. A network adapter 945 also can be coupled to system 900 in order to couple system 900 to other systems, computer systems, remote printers, and/or remote storage devices through intervening private or public networks. Modems, cable modems, Ethernet cards, and wireless transceivers are examples of different types of network adapter 945 that can be used with system 900.

Memory and storage arrangement 920 may store an EDA application 950. EDA application 950, being implemented in the form of executable program code, is executed by processor(s) 905. As such, EDA application 950 is considered part of system 900. System 900, which is configured as a design tool while executing EDA application 950, receives and operates on circuit design 100. In one aspect, system 900 performs a design flow on circuit design 100, and the design flow may include synthesis, mapping, placement, routing, physical optimization, and combining with debugging support circuitry as described herein. System 900 generates version of circuit design 100 combined with the debugging support circuitry as circuit design 960.

EDA application 950, circuit design 100, circuit design 960, and any data items used, generated, and/or operated upon by EDA application 950 are functional data structures that impart functionality when employed as part of system 900 or when such elements, including derivations and/or modifications thereof, are loaded into an IC such as a programmable IC causing implementation and/or configuration of a circuit design within the programmable IC.

Various logic may be implemented as circuitry to carry out one or more of the operations and activities described herein and/or shown in the figures. In these contexts, a circuit or circuitry may be referred to as "logic," "module," "engine," or "block." It should be understood that logic, modules, engines and blocks are all circuits that carry out one or more of the operations/activities. In certain implementations, a programmable circuit is one or more computer circuits programmed to execute a set (or sets) of instructions stored in a ROM or RAM and/or operate according to configuration data stored in a configuration memory.

Some implementations are directed to a computer program product (e.g., nonvolatile memory device), which includes a machine or computer-readable medium having stored thereon instructions which may be executed by a computer (or other electronic device) to perform these operations/activities.

Though aspects and features may in some cases be described in individual figures, it will be appreciated that features from one figure can be combined with features of another figure even though the combination is not explicitly shown or explicitly described as a combination.

The methods and system are thought to be applicable to a variety of systems for debugging circuit designs. Other aspects and features will be apparent to those skilled in the art from consideration of the specification. The methods and system may be implemented as one or more processors configured to execute software, as an application specific integrated circuit (ASIC), or as a logic on a programmable logic device. It is intended that the specification and drawings be considered as examples only, with a true scope of the invention being indicated by the following claims.

What is claimed is:

1. A method comprising:
registering by debug circuitry, candidate sample values in a plurality of sample periods while application circuitry is active, the candidate sample values indicating states of a plurality of candidate signals of the application circuitry;
writing sample values of first probed signals from each sample period to a sample memory using a mapping based on bit-widths of the first probed signals, wherein the sample values of the first probed signals are selected from the candidate sample values;
updating the mapping based on bit-widths of second probed signals; and
writing sample values of the second probed signals from each sample period to the sample memory using the mapping, wherein the sample values of the second probed signals are selected from the candidate sample values.

2. The method of claim 1, wherein the mapping indicates a probe depth, and the method further comprising:
limiting writing of the sample values of the first probed signals based on the probe depth; and
wherein updating the mapping includes updating the probe depth in response to input of a changed value of the probe depth.

3. The method of claim 1, wherein the mapping indicates first probe depths associated with the first probed signals, respectively, and the method further comprising:
limiting writing of each sample value of the sample values of the first probed signals based on the first probe depths;
wherein updating the mapping includes updating the mapping to indicate second probe depths associated with the second probed signals, respectively, in response to input of the second probe depths; and limiting writing of each sample value of the sample values of the second probed signals based on the second probe depths.

4. The method of claim 1, wherein the writing includes writing one or more sample values of the first probed signals across one or more word address boundaries in response to the mapping indicating a total of bit-widths of the first probed signals being less than or greater than a number of bits in a word of the sample memory.

5. The method of claim 1, wherein:
the writing of the sample values of the first probed signals includes writing the sample values of the first probed signals to contiguous bit addresses in the sample memory; and
the writing of the sample values of the second probed signals includes writing the sample values of the second probed signals to contiguous bit addresses in the sample memory.

6. The method of claim 5, further comprising, storing, in response to assertion of a trigger signal at one sample period of the plurality of sample periods, values that indicate a word address and a bit column of the sample memory at which the sample values of the first probed signals in the one sample period are written.

7. The method of claim 1, wherein writing the sample values of the second probed signals includes writing the sample values of the second probed signals at locations in the sample memory at which the sample values of the first probed signals were written.

8. The method of claim 1, wherein:
registering the candidate sample values includes registering the candidate sample values from the application circuitry that is disposed on a semiconductor die; and
writing the sample values of the first probed signals and writing the sample values of the second probed signals includes writing the sample values of the first probed signals and the sample values of the second probed signals to the sample memory that is disposed on the semiconductor die.

9. The method of claim 1, wherein:
registering the candidate sample values includes registering the candidate sample values from the application circuitry that is disposed on a first semiconductor die; and
writing the sample values of the first probed signals and writing the sample values of the second probed signals includes writing the sample values of the first probed signals and the sample values of the second probed signals to the sample memory that is disposed on a second semiconductor die.

10. The method of claim 1, further comprising, inputting data that identify the second probed signals by the debug circuitry via a scan interface.

11. A circuit arrangement, comprising:
a sample memory;
a capture circuit configured to register candidate sample values in each sample period of a plurality of sample periods while application circuitry is active, the candidate sample values indicating states of a plurality of candidate signals of the application circuitry; and
a memory manager circuit coupled between the sample memory and the capture circuit and configured to:
write sample values of first probed signals from each sample period to the sample memory using a mapping based on bit-widths of the first probed signals, wherein the sample values of the first probed signals are selected from the candidate sample values, update the mapping based on bit-widths of second probed signals, and
writing sample values of the second probed signals from each sample period to the sample memory using the mapping, wherein the sample values of the second probed signals are selected from the candidate sample values.

12. The circuit arrangement of claim 11, wherein:
the mapping indicates a probe depth;
the memory manager is configured to limit writing of the sample values of the first probed signals based on the probe depth; and
the memory manager is configured to update the probe depth in response to input of a changed value of the probe depth.

13. The circuit arrangement of claim 11, wherein:
the mapping indicates first probe depths associated with the first probed signals, respectively; and
the memory manager is configured to:
limit writing of each sample value of the sample values of the first probed signals based on the first probe depths,
update the mapping to indicate second probe depths associated with the second probed signals, respectively, in response to input of the second probe depths, and
limit writing of each sample value of the sample values of the second probed signals based on the second probe depths.

14. The circuit arrangement of claim 11, wherein the memory manager is configured to write one or more sample values of the first probed signals across one or more word address boundaries in response to the mapping indicating a total of bit-widths of the first probed signals being less than or greater than a number of bits in a word of the sample memory.

15. The circuit arrangement of claim 11, wherein the memory manager is configured to:
write the sample values of the first probed signals to contiguous bit addresses in the sample memory; and
write the sample values of the second probed signals to contiguous bit addresses in the sample memory.

16. The circuit arrangement of claim 15, wherein the memory manager is configured to store, in response to assertion of a trigger signal at one sample period of the plurality of sample periods, values that indicate a word address and a bit column of the sample memory at which the sample values of the first probed signals in the one sample period are written.

17. The circuit arrangement of claim 11, wherein the memory manager is configured to write the sample values of the second probed signals at locations in the sample memory at which the sample values of the first probed signals were written.

18. The circuit arrangement of claim 11, wherein:
the capture circuit is configured to register the candidate sample values from the application circuitry that is disposed on a semiconductor die; and
the sample memory is disposed on the semiconductor die.

19. The circuit arrangement of claim 11, wherein:
the capture circuit is configured to register the candidate sample values from the application circuitry that is disposed on a first semiconductor die; and
the sample memory is disposed on a second semiconductor die.

20. The circuit arrangement of claim 11, wherein the memory manager is configured to input via a scan interface, data that identify the second probed signals.

\* \* \* \* \*